(12) United States Patent
Krimon et al.

(10) Patent No.: US 9,013,207 B2
(45) Date of Patent: Apr. 21, 2015

(54) METHOD AND APPARATUS FOR CHIP SELF DEACTIVATION

(71) Applicant: Intel Corporation, Santa Clara, CA (US)

(72) Inventors: Yuri I. Krimon, Folsom, CA (US); David I. Poisner, Carmichael, CA (US); Reinhard R. Steffens, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/728,772

(22) Filed: Dec. 27, 2012

(65) Prior Publication Data

US 2014/0184266 A1    Jul. 3, 2014

(51) Int. Cl.
*H03K 19/00* (2006.01)
*H03K 19/003* (2006.01)

(52) U.S. Cl.
CPC ................................. *H03K 19/003* (2013.01)

(58) Field of Classification Search
USPC .............................................. 326/8–9, 14–16
See application file for complete search history.

(56) References Cited

U.S. PATENT DOCUMENTS

| 7,183,799 B1 * | 2/2007 | Donlin et al. .................. 326/38 |
| 8,151,094 B2 * | 4/2012 | Vera et al. ...................... 712/220 |
| 2008/0061816 A1 * | 3/2008 | Borkenhagen et al. ........... 326/8 |

* cited by examiner

*Primary Examiner* — Anh Tran
(74) *Attorney, Agent, or Firm* — Green, Howard & Mughal LLP

(57) ABSTRACT

In some embodiments, provided is a processor chip including self deactivation logic to deactivate the processor chip after a threshold of qualified events have been monitored.

20 Claims, 1 Drawing Sheet

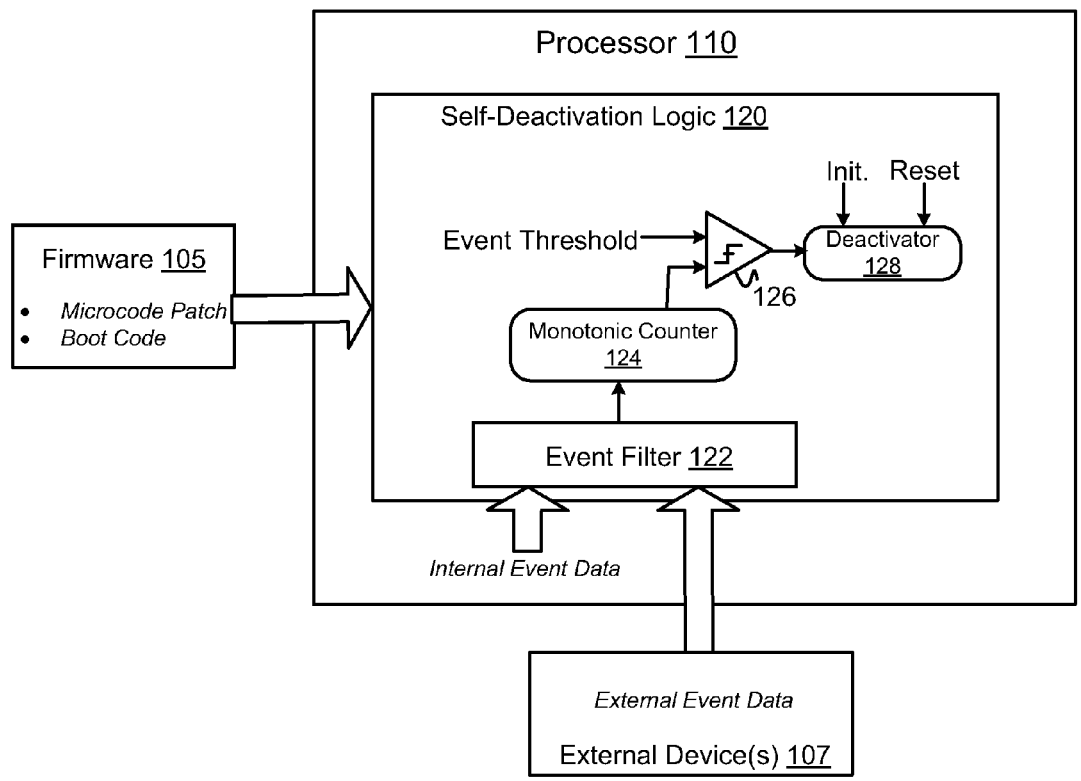

METHOD AND APPARATUS FOR CHIP SELF DEACTIVATION

TECHNICAL FIELD

The present invention relates generally to integrated circuit chip security, and in particular, to chip self-deactivation.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 1 shows a processor with deactivation logic in accordance with some embodiments.

DETAILED DESCRIPTION

With some semiconductor chip manufacturers, quantities of chips for test purposes, sometimes referred to as "engineering samples", are provided to external entities such as OEMs, ODMs, ISVs, IBVs, TPVs, and the like. Recipients are typically obliged to return the samples to the manufacturer or alternatively, to destroy the samples themselves. However, many do not get returned or destroyed. Samples may get stolen and used inappropriately, for example, from a security standpoint, they may be more vulnerable to bugs or to reverse engineering since they may have diagnostic features not available on commercially released products. Moreover, they may be fraudulently sold to users as genuine product (e.g., grey market). Aside from creating loss of sales opportunity, this creates problems from PR and Liability standpoint with the end users, especially if the engineering samples have lower quality, performance, or long-term reliability.

In some embodiments, chips with a self-deactivation capability may be provided. A processor chip, such as a server CPU chip, mobile device SoC processor, a personal computer CPU, or any other processor may have logic to estimate the passage of time and to initiate a self deactivation when a threshold has been reached. In some embodiments, it may also have the ability to re-activate itself, e.g., in response to a reset from an external source and/or to deactivate itself in response to an external command. In some embodiments, it may also have the ability to modify its threshold and/or estimation parameters by way of external updates.

It some embodiments, it estimates the passage of time by counting specific processor-visible events. When the count reaches a threshold, the processor changes to a deactivated state. In this state, the processor may externally expose a signature that indicates the cause of the deactivation, as well as be able to accept a new command (e.g., by way of a microcode patch) that removes the paralysis (re-activates) and extends the active life time of the processor.

FIG. 1 is a general block diagram showing a processor chip with a self deactivation capability. It includes a processor chip 110 including self deactivation logic 120, firmware 105 and external devices 107. These blocks may be part of a common computing platform such as a mobile device (smartphone, tablet, notebook), server computer or other workstation apparatus.

The firmware 105 may have a micro-code patch and boot code (e.g., BIOS). It may have other code but a microcode patch is illustrated as an example of an external source for updating and/or commanding the deactivation logic 120. The processor, when starting up, will typically load microcode that is disposed within the Processor itself, along with the updateable patch to perform a variety of initialization functions before running its systems. Any suitable method could be used, but the micro-code patch may serve as an acceptable vehicle for updating and/or commanding the deactivation logic 120.

The external devices block 107 represents one or more devices that may provide event information to be used by the deactivation logic 120. For example, it could encompass a chipset device (e.g., platform control hub), a test station, a platform emulator, memory, or any other devices that may be coupled to a powered on processor, whether or not it is in a test, validation, or working environment. Accordingly, an external event may encompass any external information coming into the processor that can be used by the deactivation logic to estimate elapsed time in accordance with a desired, self-imposed available life cycle.

In some embodiments, the deactivation logic 120 includes event filter 122, monotonic counter 124, comparator 126, and deactivator 128, coupled as shown. The event filter operates to evaluate internal and/or external event data to determine if a qualified event has occurred. If a qualified event occurs, it increments the monotonic counter 124.

A qualified event is a processor or platform event that serves as an indicia that time has elapsed, that does not thwart legitimate testing/validation operation, and/or that will reasonably result in the processor de-activating once a target life cycle has elapsed. (this could be an absolute amount of time, an amount of operational time, or a combination thereof.) Qualified events could be any event, internal and/or external to the processor that allow the deactivation logic to satisfy one or more of these objectives. They could include, but are not limited to, the following event examples:

(1) qualified processor resets. For example, the filter might exclude resets that occur to close to one another, e.g., in a short time window that may be indicative of legitimate tests such as "fast reset" stress or power cycling tests;

(2) processor memory cycles to system memory;

(3) DRAM refreshes; and (4) arrival of periodic special data packets from a control hub or other subsystem. For example, a PCH or embedded module in an SoC may send a packet to the processor once per minute while the system is in an ACPI S0 state.

It is anticipated that there may be other events to be counted, depending on particular design considerations. The event filter may be updated to change what constitutes a qualified event, and the filter may comprise logic to weight events and/or place criteria on potentially qualifying events. It may also include logic to increment the count when a satisfactory combination of one or more of the qualified events has occurred. Moreover, event thresholds within the filter could be used to scale down the number of counts actually incrementing the counter 124 in order to simplify its topology (e.g., a 64 bit counter would require less circuit elements than a 128 or 256 bit counter).

The monotonic counter is a circuit block comprising persistent storage (e.g., non-volatile memory such as flash, PCM, STT-MRAM, and field programmable fuse technologies, to mention just a few). For processors that have integrated non-volatile storage (separate Flash EPROM in the package), the count could be recorded in that memory, e.g., many processors such as server CPUs may already have flash EPROM integrated in the package. The counter could be made from conventional counter logic with count values stored in the non-volatile memory. For chips without non-volatile memory, other technologies could be used. For example, Field Programmable Fuses (FPF) technology can be used as a building block for the monotonic counter. In some embodiments, the counter may, or other portions of the deactivation logic, may incorporate wear-leveling and/or error correction techniques to preserve the integrity of the counted events.

The comparator 126 compares the count with a preset event threshold level. There may be several methods for how the logic determines that the count has been reached. For example, the processor microcode (burned internally to processor and/or part of external patch) could set the event threshold value. The comparator could comprise dedicated circuit logic or it could be implemented, e.g., with the microcode comparing, on each power-on, the current count with the threshold value. In some embodiments, a fixed state machine could be used, e.g., to compare the current count with the count threshold. In some embodiments, the logic may not necessarily rely on a single counter reacting based on its maximum allotted value. Instead, a programmable weighted combination of different counter values may be used to determine a timeout.

As with the other logic blocks, the deactivator 128 could be implemented in any suitable manner. Once the timeout has been reached, there may be several ways for the deactivation (and possibly restoring) to occur. For example, the processor could lock and not execute any instructions, with the possible exception of a specific sequence to perform an authorized microcode patch update. While in the deactivation state, the processor may output an indication (error code) onto one of its busses, such as a memory interface, TAP/ITP, or the connection to an external controller, USB, LPT/eSPI, Port 80, and the like. In some embodiments, the processor could continue to execute, but at a reduced performance. This may be invoked just prior to the maximum count being reached so as to provide an advanced warning that the system would soon become "paralyzed". In yet other embodiments, if the platform supports a trusted sprite mechanism, a specific icon could be placed on the screen to warn the user that their platform was about to be paralyzed.

There may be a separate desire to limit the shelf life of a processor, e.g., a processor test chip or sample. For example, a six month expiration may be desired. This could apply even if the unit had never been used or had been used less than the maximum "active time" defined above. In some embodiments, this could be implemented by having an external source, e.g., microcode patch, issuing a deactivation command (e.g., via the Init. input of the deactivator 128). For example, code in the microcode could check to see if a suitably current BIOS (or the like) version is present in the processor, or the BIOS could check to confirm that a suitably current microcode patch version is in the Processor. It is possible that much of the same mechanism for creating the paralysis could be re-used after some absolute time-out rather than just after the maximum count is reached (or some combination of time and counts). For example, the microcode patch could be used to "reset" the deactivator 128.

The afore discussed methods primarily address estimating elapsed time based on processor events, but monitoring the actual elapse of time could also be imployed, alone or in combination with counted qualifying events. The ability to determine the passage of time (as opposed to events) is not required, but it may be employed. For example, a slow-discharge capacitor (e.g., leaky EPROM cell) on the same die as the processor could be charged-up prior to the chip leaving the factory. Other methods could be used, e.g., a slow-discharge capacitor on the PCB substrate, chemical reactions (micro-traces that change resistance as they oxidize), thermal reactions (micro-traces that change resistances as they are heated over time), and/or thin-film batteries powering a dedicated counter, to mention just a few.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus, comprising:
   a processor chip including self deactivation logic to deactivate the processor chip after a threshold of qualified events have been monitored, wherein the deactivation logic can be updated by way of an externally provided programming code.

2. The apparatus of claim 1, wherein the deactivation logic comprises an event filter to evaluate internal event data to determine whether a qualified event has occurred.

3. The apparatus of claim 2, wherein the event filter is to monitor both internal and external event data to determine whether a qualified event has occurred.

4. The apparatus of claim 2, wherein a qualified event is a processor or platform event that serves as an indicia that time has elapsed.

5. The apparatus of claim 4, wherein the time corresponds to operational time.

6. The apparatus of claim 4, wherein the time corresponds to absolute time.

7. The apparatus of claim 3, wherein a qualified event includes a processor reset that is not too close in time to a previous processor reset.

8. The apparatus of claim 7, wherein a qualified event includes a quantity of processor memory cycles to system memory.

9. The apparatus of claim 1, wherein the deactivation logic includes a counter to count the qualified events.

10. The apparatus of claim 9, wherein the counter is a monotonic counter.

11. The apparatus of claim 10, wherein the monotonic counter is formed from field programmable fuses.

12. The apparatus of claim 1, wherein the externally provided code includes a micro-code patch.

13. A chip, comprising:
an event filter to monitor chip activity to determine if a qualified event occurs;
a counter to store a value corresponding to a number of the qualified events that have occurred; and
a deactivator to deactivate the chip when the counter indicates that a sufficient number of qualified events has occurred.

14. The chip of claim 13, wherein the counter includes counter logic and non-volatile memory to store a count that persists when the chip is powered off.

15. The chip of claim 13, wherein the counter includes counter logic formed from field programmable fuses to store and maintain a count even when the chip is powered off.

16. The chip of claim 13, wherein the deactivator is to inhibit normal operation of the chip when the sufficient number of events has occurred.

17. The chip of claim 13, further comprising multiple processing cores, wherein the event filter, counter and deactivator are outside of the multiple processing cores.

18. A circuit, comprising:
deactivation logic, with persistent memory, which is operable to deactivate a processor after a qualified event, wherein the qualified event includes:
an estimate that the processor has aged for a specified amount of time; and
an indication that a time corresponding to operational time has elapsed.

19. The circuit of claim 18, wherein ageing for the specified amount of time corresponds to a threshold number of qualified events occurring.

20. The circuit of claim 18, wherein the deactivation logic includes a counter to count the qualified events.

* * * * *